(12) United States Patent
Wach

(10) Patent No.: US 6,483,635 B1
(45) Date of Patent: Nov. 19, 2002

(54) APPARATUS FOR LIGHT AMPLIFICATION

(75) Inventor: Michael L. Wach, Atlanta, GA (US)

(73) Assignee: Cirrex Corp., Atlanta, GA (US)

( * ) Notice: Subject to any disclaimer, the term of this patent is extended or adjusted under 35 U.S.C. 154(b) by 0 days.

(21) Appl. No.: 09/876,897

(22) Filed: Jun. 7, 2001

Related U.S. Application Data

(60) Provisional application No. 60/210,075, filed on Jun. 7, 2000.

(51) Int. Cl.$^7$ ................................................. H01S 3/00
(52) U.S. Cl. ....................................... 359/344; 359/337
(58) Field of Search ................................ 359/344, 337; 372/50

(56) References Cited

U.S. PATENT DOCUMENTS

| | | |
|---|---|---|
| 3,187,639 A | 6/1965 | Kelly et al. |
| 4,479,499 A | 10/1984 | Alfano |
| 4,733,933 A | 3/1988 | Pikulski |

(List continued on next page.)

OTHER PUBLICATIONS

Fan et al., "Tapered Polymer Single–Mode Waveguides for Mode Transformation," *Journal of Lightwave Technology*, vol. 17, No. 3, Mar. 1999, pp. 466–474.
Itaya et al., "Spot–size Converter Integrated Laser Diodes (SS–LDs)," *IEICE Trans. Electron.*, vol. E80–C, No. 1, Jan. 1997, pp. 30–36.
Kanda, Torahiko et al., "A New Spherical Mirror–Finish Surface Machining Technology for Optical Fiber Connector," *NEC Rec. & Develop*, vol. 36, No. 2, pp. 271–279, Apr. 1995.
Ku, R.T., "Progress in Efficient/Reliable Semiconductor Laser–to–Single–Mode Fiber Coupler Development," pp. 4–6, 1984.
Robertson et al., "The Expanded Mode Laser—A Route to Low Cost Optoelectronics," *IEICE Trans. Electron.*, vol. E80–C, No. 1, Jan. 1997, pp. 17–23.
Russo, V. et al., "Microlens–Ended Fibers: A New Fabrication Technique," *Istituto di Ricerca sulle Onde Elettromagnetiche, Firenze, Italy*, pp. 21–27, date not available.
Russo V. and Margheri, G., "Lens Ended Fiber–Fiber Connections for Power Laser Applications," *SPIE*, vol. 701 ECOOSA, pp. 220–225, 1986, month not available.
Saini et al., "Compact Mode Expanded Lasers Using Resonat Coupling Between a 1.55–$\mu$m InGaAsP Tapered Active Region and an Underlying Coupling Waveguide," *IEEE Photonics Technology Letters*, vol. 10, No. 9, Sep. 1998, pp. 1–3.
Shintaku, Toshihiro et al., "Connection Mechanism of Physical–Contact Optical Fiber Connectors with Spherical Convex Polished Ends," *Applied Optics*, vol. 30, No. 36, pp. 5260–5265, Dec. 1991.
Shintaku, Toshihiro et al., "Highly Stable Physical–Contact Optical Fiber Connectors with Spherical Convex Ends," *Journal of Lightwave Technology*, vol. 11, No. 2, pp. 241–248, Feb. 1993.

*Primary Examiner*—Mark Hellner
(74) *Attorney, Agent, or Firm*—King & Spalding

(57) ABSTRACT

A system for reducing reflection of an optical system can reduce or eliminate reflection at facets of a semiconductor gain medium and can suppress natural longitudinal modes produced within the semiconductor gain medium. In combination with external feedback, the system can allow more precise wavelength control of the light output of a laser, thereby allowing the laser to be used in a dense wavelength division multiplexing system. The system employs a patterned relief surface disposed on a facet of a gain medium. The patterned relief surface may be a "motheye" pattern having a plurality of conical posts disposed on the surface of the facet. The system may be combined with conventional devices, such as a Bragg reflector or a microelectromechanical component, to further improve wavelength control of a resonant optical cavity, thereby improving the operation of optical communications systems.

38 Claims, 9 Drawing Sheets

U.S. PATENT DOCUMENTS

| | | | | |
|---|---|---|---|---|
| 4,911,516 A | * | 3/1990 | Palfrey et al. | 350/96.19 |
| 5,308,656 A | | 5/1994 | Emmons et al. | |
| 5,373,519 A | * | 12/1994 | Siono et al. | 372/43 |
| 5,404,218 A | | 4/1995 | Nave et al. | |
| 5,426,657 A | * | 6/1995 | Vakhshoori | 372/45 |
| 5,486,378 A | | 1/1996 | Oestreich et al. | |
| 5,529,680 A | | 6/1996 | Kitada et al. | |
| 5,636,307 A | | 6/1997 | Cowen et al. | |
| 5,710,626 A | | 1/1998 | O'Rourke et al. | |
| 5,939,137 A | | 8/1999 | Kuck et al. | |
| 5,974,837 A | | 11/1999 | Abbott, III et al. | |
| 6,043,936 A | * | 3/2000 | Large | 359/572 |

* cited by examiner

APPARATUS FOR LIGHT AMPLIFICATION

PRIORITY CLAIM

This application claims the benefit of priority to U.S. Provisional Application No. 60/210,075, entitled "Apparatus for Light Amplification," filed Jun. 7, 2000.

BACKGROUND OF THE INVENTION

1. Field of the Invention

The present invention relates generally to the manipulation of light in optical communication networks and fiber optic systems. Particularly, the present invention relates to elements disposed within the light stream of a fiber optic communications network, such as a DWDM network. More particularly, the present invention relates to anti-reflective structures for use in semiconductor lasers and amplifiers.

2. Related Art

Optical communication systems are a vital part of today's communication networks. In a typical optical communication system, information-containing optical signals are transmitted along an optical fiber. Lasers are important components of optical communication systems for producing the information-containing signals. Information is modulated upon light signals emitted from the laser into the optical fiber. Initially, optical fibers were used to carry only a single data channel at one wavelength in one direction. Technology, such as wavelength division multiplexing (WDM), has increased the amount of information transferred over a single optical fiber communication system by multiplexing several signals on a single fiber. WDM allows the launching and retrieving of multiple data channels in and out of an optical fiber. Each data channel is transmitted in a unique wavelength region. The WDM wavelength regions are typically hundreds of nanometers apart.

An improvement on WDM is dense wavelength division multiplexing (DWDM), which allows channels of information to be propagated at different wavelength regions that can be spaced spectrally at a set wavelength or frequency distance apart from one another. For DWDM, information channels may propagate at industry standard spacings that may be on the order of one or two nanometers apart from one another. Typically, DWDM systems operate with fine wavelength separations from one laser to the next of about 0.8 to 1.6 nanometers (nm). Thus, for DWDM, lasers must operate at precisely determined wavelengths to avoid interference with other channels.

DWDM lasers and many communications lasers typically comprise a semiconductor lasing medium contained within an optical cavity. Such lasers are frequently referred to as diode lasers, semiconductor lasers, or laser diodes. A laser operates through stimulated emission, whereby light is emitted from excited atoms or molecules of the lasing medium. In operation of the laser, the lasing medium is disposed in an optical cavity of the laser that is situated between two reflectors. Light intensity is amplified as the photons oscillate back and forth between the reflectors, which stimulates further photon emission in the lasing medium. For this reason, the lasing medium is sometimes referred to as a gain medium. By making at least one of the reflectors partially transmissive, monochromatic radiation is emitted when the light passes through the reflector. Monochromatic radiation is typically radiation containing a narrow wavelength region of light. This wavelength region of light may appear as one visible color, for example, red, blue, green, or yellow, etc., or it may be invisible, for example, ultraviolet or infrared light. Infrared light is typical of DWDM optical networks.

Fabry-Perot diode lasers are a type of laser in which the cavity reflectors can be formed by the boundary surfaces of a semiconductor material itself. The boundary surfaces are typically referred to as front and rear facets, wherein the front facet is the port of primary light emission. Thus between these mirrored facets lies a section of semiconductor material that comprises a waveguided gain medium. The optical cavity is formed between the front and rear facets. Typically, the rear facet strongly reflects light resonating within the cavity. The front facet partly reflects the light resonating within the cavity and partly transmits the light at a laser wavelength region. The laser wavelength region is the wavelength region of light emitted from the laser; it is defined, at least in part, by the length of the cavity. The light reflected back from the front and rear facets sustains oscillation by interacting with excited atoms to drop electrons from the upper level to the ground state, thereby emitting photons. Various parameters associated with the optical cavity can be adjusted to alter the wavelength characteristics of the emitted light, such as varying the spacing between the front and rear facets. For example, the cavity may be so short as to only allow the laser to operate in 'single mode' and thereby only emit light at a single wavelength position; the length of this cavity can be varied to "tune" this spectral position.

While Fabry-Perot lasers are inexpensive to produce, their output is not optimized for many applications. They typically operate in a multi-mode state wherein a broad spectral range is emitted. This undesirable characteristic arises from the energy reflection that occurs at the facet surfaces. The reflection is due to the refractive index of the semiconductor lasing medium being high relative to that of an adjacent medium such as air. The difference in refractive index produces a strong, innate reflection in the laser. This reflection, which defines one of the cavity mirrors and is responsible for the basic operation of the laser, is called Fresnel reflection. The lack of monochromacity of the energy output is undesirable for many optical networking applications. The plurality of radiation patterns, or longitudinal modes, that occur within the optical cavity of a Fabry-Perot laser are linked to this lack of monochromacity.

If the output of the laser is not controlled, or is "free running," multiple longitudinal modes will be seen in the output. In a typical free-running Fabry-Perot diode laser deployed in an access network employing the synchronous optical network (SONET) standard, the energy output (intensity) is often situated in the 1310 nm window. Typically, the longitudinal modes are spaced approximately 0.6 nm apart and are distributed over many nanometers, approximately 30. Additionally, the spectral output is subject to drift with temperature and other influences. Consequently, the output is unsuitable for dense wavelength division multiplexing, because of spectral overlap of adjacent DWDM signals. The output is also not well suited for high-speed fiber optic communications at wavelengths that are displaced from the optical fibers zero chromatic dispersion point, because of signal degradation due to chromatic dispersion.

By addressing the innate facet reflections and/or their influence on the longitudinal modes of a Fabry-Perot diode laser, attempts have been made to improve the quality of laser output. The reflections can be either redirected or suppressed so that the natural modes are eliminated or minimized. Free from these reflections, a number of techniques are available to stabilize the laser so that it emits light at a single, or at least tightly confined, wavelength position.

To overcome the above problems, semiconductor distributed feedback (DFB) lasers are frequently used in DWDM communications networks as an alternative to free running Fabry-Perot lasers. DFB lasers utilize wavelength-selective feedback to make certain modes in the optical cavity of the laser oscillate more strongly than others, thus causing the laser to output light in a tightly confined wavelength region. DFB lasers attempt to achieve precise wavelength control, thereby allowing lasers to be used with DWDM systems. DFB lasers typically include a semiconductor gain medium, as discussed above, but with an added feature that controls the output wavelength of the laser. The semiconductor gain medium of a DFB laser is imparted with a periodic (repeating) structure that limits the emitted light to a tightly defined wavelength region. The periodic structure may be a corrugated structure or an undulation in refractive index. The structure is designed so that light of a particular wavelength will be constructively reflected back and forth to achieve lasing. Lasing approaches single mode operation, with the result of preventing other unwanted longitudinal modes from lasing. However, DFB lasers are not easy to manufacture because the techniques required to produce the periodic structure are cumbersome and are not readily reproducible to generate proper parameters. Additionally, DFB lasers are temperature sensitive because the output wavelength of DFB lasers varies as the temperature changes. They are also susceptible to performance variations due to the refractive index of the semiconductor medium varying with the intensity and propagation of output pulses of light. Consequently, DFB lasers have many shortcomings.

Another method for overcoming the problems of conventional laser devices, such as Fabry-Perot lasers, involves suppressing reflection produced by the facet. One suppression technique employs an antireflective coating formed on the facet. The coating is formed by depositing a stack of thin-film layers having high-low, alternating refractive indices to the facet. Fresnel reflections arising from the different refractive index interfaces between layers set up a pattern of constructive and destructive interference that minimizes the reflection from the facet. However, there are difficulties associated with designing and fabricating such a coating for practical application, as the performance tolerances are formidable. Another disadvantage arises from the inherent difficulty in attaining anti-reflection over a broad spectral band. Another disadvantage arises from the tight precision that is required for the thickness of the layers.

Another conventional approach for suppressing facet reflection involves angling one of the facets so that its internal reflections are not cast back towards the other facet. Consequently, a condition of back-and-forth reflections from front and rear facets is precluded so that longitudinal modes are suppressed. In addition to fabrication difficulties, this approach is inefficient. The optical axis of the emitted beam is bent by the angled facet with respect to the longitudinal axis of the semiconductor gain medium. This results in alignment problems and assembly complications when coupling light into various optical elements.

Other light amplification devices suffer from the same disadvantages discussed above. For example, a semiconductor optical amplifier (SOA) is constructed and operates somewhat similarly to the laser described above. SOAs have the capability of directly amplifying an optical signal without first converting it to an electrical signal. accordingly, SOAs are useful as repeaters, preamplifiers, and amplifiers in optical communication systems. Conventional SOAs are constructed somewhat as a modified laser diode. An optical gain region is formed between two facets, but the facets are typically covered with antireflection coatings so that the SOA operates as an amplifier rather than a laser. Alternatively, the facets may be angled with respect to the longitudinal axis of the gain medium and/or the flow of light within this medium so as to reduce the light reflected within the gain medium. Consequently, there is no resonant cavity. An SOA differs from a laser in that light does not reflect back and forth within the gain medium. Rather, an SOA receives an optical signal through one facet, amplifies the optical signal as it passes through the gain medium, and then transmits the amplified optical signal through the opposite facet. The optical signal passes through the SOA essentially one time during which it generates stimulated emissions that build up so as to amplify the signal. For this reason, SOAs are often referred to as a type of "traveling wave amplifier." SOAs suffer from the same disadvantages as conventional lasers. For example, light emitted through the facet of the SOA is deteriorated due to residual, unwanted reflection from the facet that is insufficiently suppressed by the antireflective coating or angled facet.

Accordingly, there is a need in the art for improved approaches to minimizing the reflections from facets of semiconductor lasers and other related semiconductor gain devices. Additionally, there is a need in the art for improved approaches to suppressing the unwanted longitudinal modes of semiconductor lasers and other related semiconductor gain devices. Specifically, there is a need in the art for a system and method that provides laser output while suppressing light reflected by the facet and while suppressing the innate longitudinal modes of the laser. Additionally, there is a need for a system and method that allows amplification of an optical signal while suppressing light reflected by the facets of the optical amplifier. Furthermore, there is a general need to suppress reflections from the optical surfaces of optical elements that are disposed in the light path of fiber optic communication networks, including DWDM networks.

SUMMARY OF THE INVENTION

The present invention can solve the problems of conventional laser devices by reducing or eliminating reflection from laser facets and by suppressing unwanted longitudinal modes produced in the optical cavity of the laser. Accordingly, the present invention can allow more precise wavelength control of the light output of a laser. Suppressing the unwanted longitudinal modes output by a laser can provide an output that approaches a single wavelength, or is at least tightly confined within a narrow wavelength spectrum, thereby allowing the laser to be used in a dense wavelength division multiplexing system.

In an exemplary semiconductor gain device according to the present invention, an optical cavity can be formed between two reflectors. A semiconductor gain medium can be disposed in the optical cavity wherein the semiconductor gain medium includes a front and rear facet, and a patterned structure can be disposed on one of the facets. When the semiconductor gain medium is excited to produce light emissions propagating through a facet of the device, the patterned structure can suppress the laser's unwanted longitudinal modes of output, by suppressing reflection of the light from the facet. The patterned structure may be a "motheye" pattern having a plurality of conical posts disposed on the surface of the facet. The conical posts may also have a pyramid structure, or the patterned structure may include lines, cones, holes, grids, or microlens arrays.

The present invention can also improve the operation of semiconductor optical amplifiers (SOAs). The patterned structure described above may be disposed on facets of an SOA to minimize emitted light reflected by the facet and to suppress any unwanted longitudinal modes output by the amplifier. Accordingly, the present invention can improve the performance of SOAs, thereby allowing them to be deployed in optical networks and integrated into Planar Lightguide Circuit (PLC) devices and systems.

The present invention may be combined with conventional devices to improve the operation of optical communications systems. By integrating together novel approaches to facet reflection with conventional laser control structures, for example, a MicroElectroMechanical Systems (MEMS) component, the present invention can provide laser control in communications lasers and related devices. A MEMS component can provide external tuning of the laser cavity to further refine the laser wavelength according to various usage parameters. As another example, a grating such as a fiber Bragg grating, or other wavelength-selective reflector, can be positioned into the path of light emitted from the front facet of a laser gain medium wherein the front facet is imparted with the novel antireflection structure of the present invention. In this exemplary configuration, the rear facet provides one cavity mirror and the grating provides the opposing, wavelength-selective mirror that effects a precise wavelength output. Additionally, the present invention may be integrated in PLC devices and systems to improve the optical interconnections between high and low refractive index materials in the optical transmission path.

DETAILED DESCRIPTION OF THE EXEMPLARY EMBODIMENTS

Figure 1A:
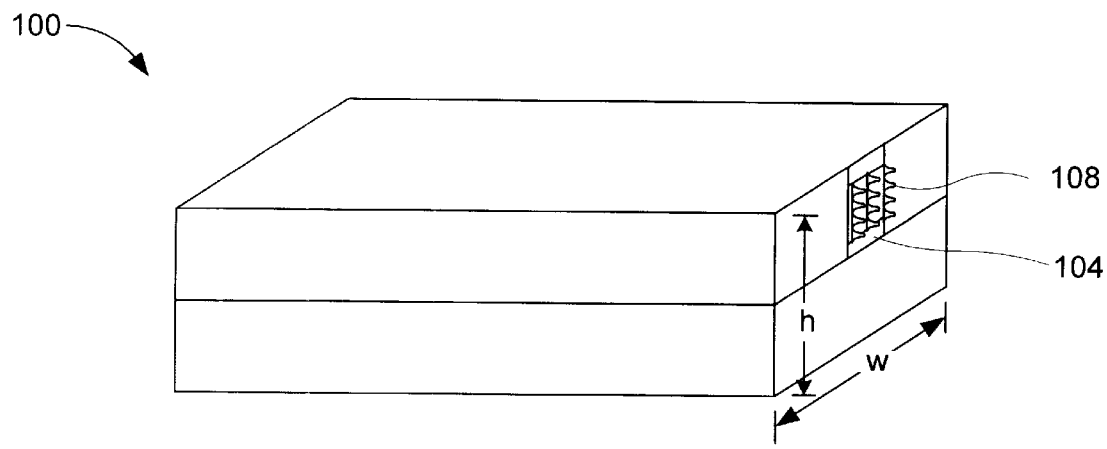
FIG. 1A illustrates a perspective view of a semiconductor laser diode according to an embodiment of the present invention.

The present invention will be described in detail with reference to the accompanying drawings, in which like reference numerals represent like elements.

The present invention reduces reflection from facets of a semiconductor gain medium by applying a patterned structure to the facet's surface. The patterned structure may be a "motheye" pattern, which is in the form of the surface structure of a moth's eyes. The patterned structure may be covered with a fine array of tiny bumps, which are sized on the order of, and may be smaller than the wavelength of visible light. These tiny bumps provide a gradual change of refractive index between air and the facet's surface. This gradual change softens the sudden change of refractive index which causes surface reflections, thereby considerably reducing the reflectance of the facet. While the principle of a motheye antireflective surface has been applied to optical windows and domes, the present invention applies motheye structures to integrated optic devices, for example, semiconductor lasers and semiconductor optical amplifiers.

Figure 1B:
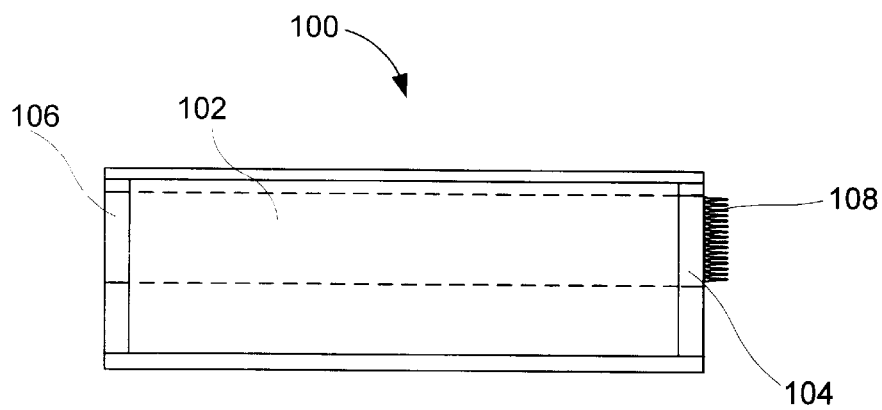
FIG. 1B illustrates a cross-section of the semiconductor laser diode shown in FIG. 1A.

A first embodiment of the present invention will be described with reference to FIGS. 1A and 1B. FIG. 1A shows a perspective view of a semiconductor gain device 100 according to an embodiment of the present invention. FIG. 1B shows a cross-section of semiconductor gain device 100. Gain device 100 includes a semiconductor gain medium 102 having a front facet 104 and a rear facet 106. A patterned structure 108 is disposed on front facet 104. An external reflector (shown in FIG. 5), which may be wavelength selective, is typically positioned in front of front facet 104. This reflector in conjunction with the rear facet, defines an optical cavity. Patterned structure 108 may be applied to the facet surface only, as indicated in FIGS. 1A and 1B, or the entire surface structure of the element may be patterned. The entire surface of the facet is the area with height h and width w, as shown in FIG. 1A. In one exemplary embodiment, gain device 100 is a multiquantum well laser, and gain device 100 could operate in the 1310 nm window or the 1550 nm window.

Operation of gain device 100 is similar to the operation of a conventional Fabry-Perot laser diode. Semiconductor gain medium 102 is excited, for example, by an external electrical source (not shown). As electrons in the excited semiconductor gain medium 102 fall from an upper level to the ground state, photons are emitted within semiconductor gain medium 102. The intensity of the light in semiconductor gain medium 102 increases as the photons reflect back and forth between the external mirror (not shown) and rear facet 106, thereby stimulating further photon emission when the photons collide with other atoms in the excited state. (In contrast, in a conventional Fabry-Perot laser, the front facet would not be covered with an antireflective treatment but it would be partially reflective and partially transmissive, and would define the cavity mirror.)

With the patterned structure 108 positioned adjacent to the front facet, the front facet 104 becomes highly transmissive. Accordingly, almost all of the light within semiconductor gain medium 102 is emitted through front facet 104 and patterned structure 108. By eliminating virtually all of the reflective properties of the front facet 104, patterned structure 108 suppresses the natural or unwanted longitudinal modes of the light emitted from gain device 100. Because of the suppression of the longitudinal modes, typically the semiconductor gain medium will not lase.

Figure 5:
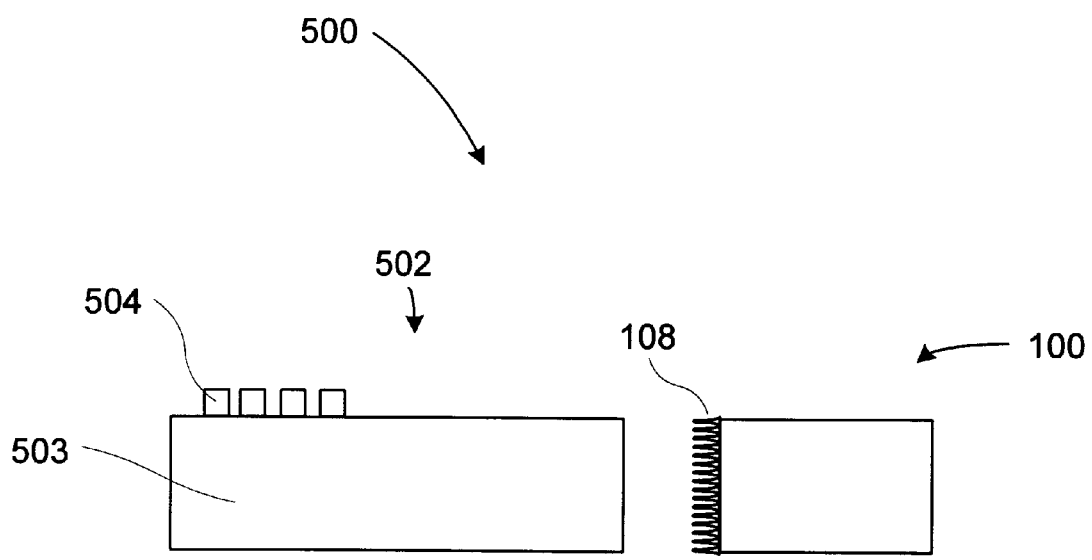
FIG. 5 illustrates an optical communication system according to another embodiment of the present invention.

Patterned structure 108 provides a gradual change of refractive index between air and the surface of front facet 104. This gradual change softens the sudden change of refractive index, thereby considerably reducing the reflectance of the surface of front facet 104. With reflection and the longitudinal modes suppressed, the laser can be stabilized, or tuned, by the wavelength-selective reflection of an aforementioned external reflector (such as illustrated in FIG. 5). In the exemplary embodiment having the external mirror, gain device 100 may be said to operate as an external cavity device. Furthermore, desired wavelengths can be adjusted or tuned using external cavity stabilization, for example, a MEMS component or other items. By suppressing facet reflection, patterned structure 108 allows the external mirror to be effective. Preferably, patterned structure 108 reduces reflection to 0.1% or less. More preferably, patterned structure 108 reduces reflection to 0.01% or less.

Figure 2A:
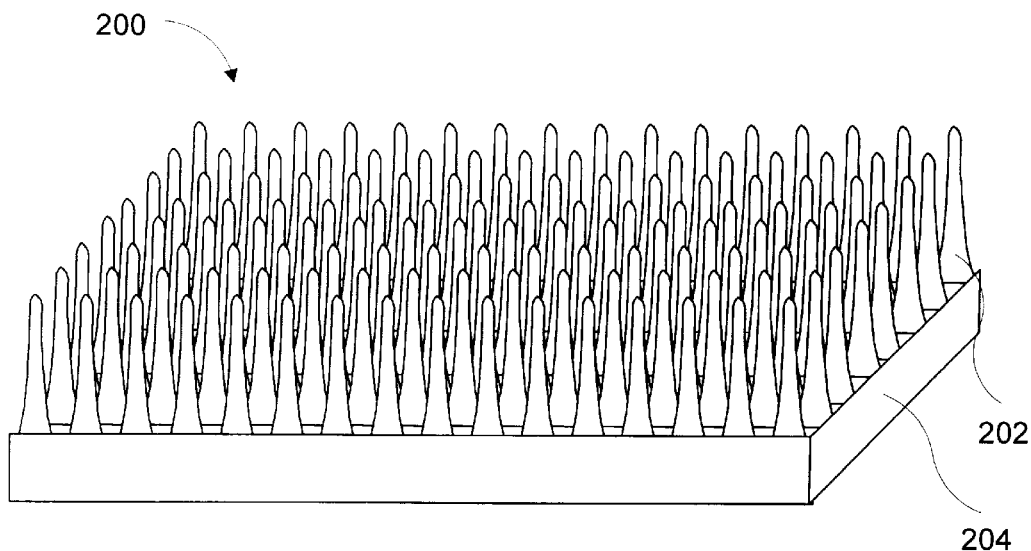
FIG. 2A illustrates a perspective view of the geometric form of a patterned structure according to one embodiment of the present invention.
Figure 2B:
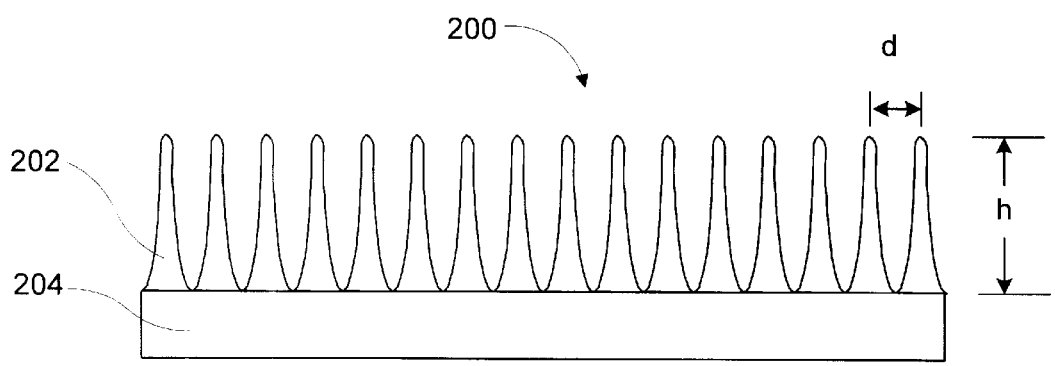
FIG. 2B illustrates a side view of the patterned structure shown in FIG. 2A.

Referring to FIGS. 2A and 2B, an embodiment of the patterned structure according to the present invention will be described. FIG. 2A shows a perspective view of the geometric form of a patterned structure 200 according to one embodiment of the present invention. FIG. 2B shows a side view of patterned structure 200 shown in FIG. 2A. In these Figures, patterned structure 200 is shown in a general form, as opposed to a geometrically precise form. As shown in FIGS. 2A and 2B, patterned structure 200 may be in the form of conical posts 202 rising from a substrate 204. Conical posts 202 can be spaced approximately an equal distance apart. Substrate 204 may be, for example, front facet 104 (FIG. 1). Alternatively, substrate 204 may be a separate component disposed on the facet's surface. Any height h of conical posts 202 and any post-to-post distance d between conical posts 202 that reduces reflection is sufficient for the present invention. Distance d and height h may each be about 0.2 microns ($\mu$). Preferably, height h is greater than about 0.4 times the wavelength of the light emitted by the laser. It is also preferable that distance d is less than the wavelength of the emitted light divided by the material index of refraction semiconductor gain medium. The present invention is not limited to the conical structure illustrated in FIGS. 2A and 2B. For example, conical posts 202 may have a pyramid structure (not shown).

Conical posts 202 may be made of any suitable material, for example, silicon, silicon dioxide, indium phosphide, tantalum pentaoxide, photoresist, III–V material, II–VI material, polymers and various doped forms of each. Preferably, conical posts 202 are composed of optically transparent material such as silicon dioxide. If front facet 104 (FIG. 1) forms substrate 204, then conical posts 202 may be composed of the same material as front facet 104, for example, indium phosphide. In that preferred embodiment, conical posts 202 may be integrally formed in the surface of front facet 104.

Figure 3A:
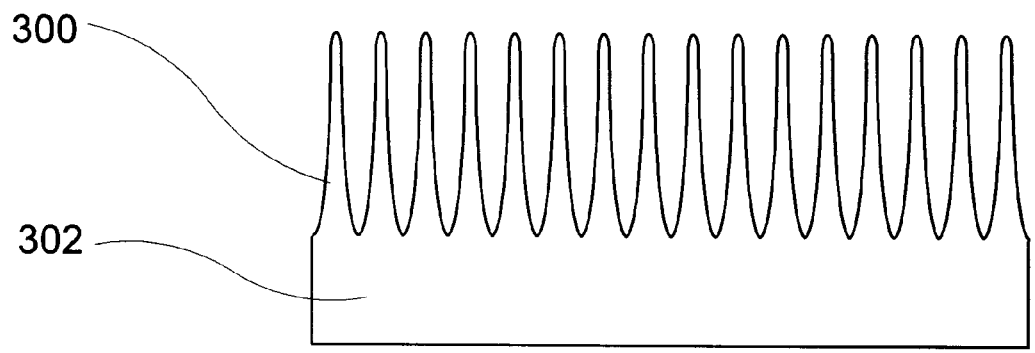
FIGS. 3A–3C illustrate alternative embodiments of the patterned structure according to the present invention.
Figure 3B:
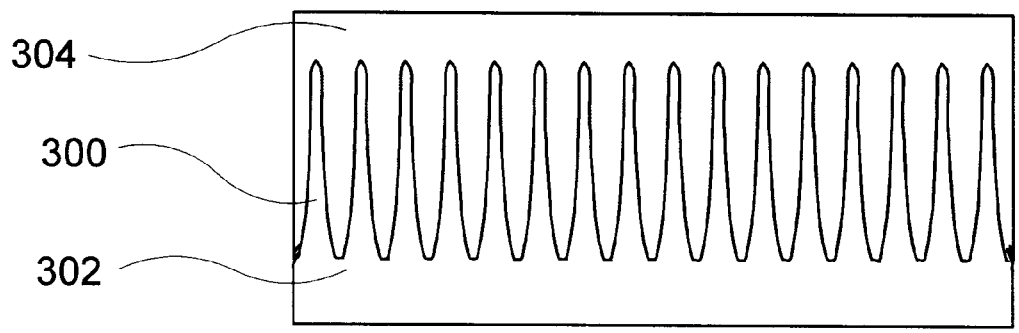
Figure 3C:
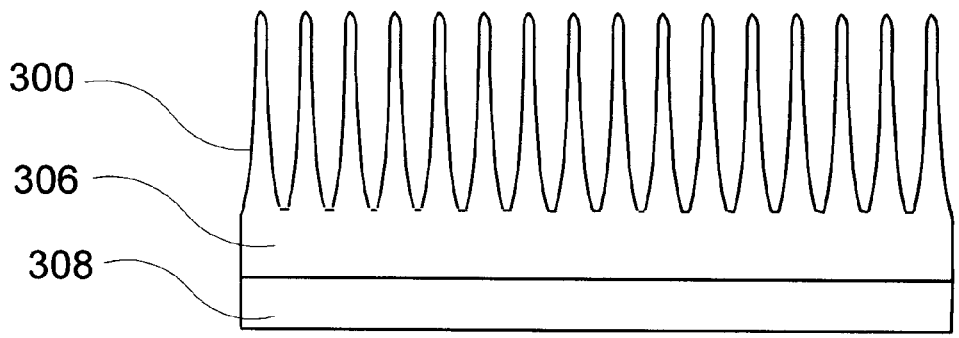

Referring to FIGS. 3A–3C, alternative embodiments of the patterned structure according to the present invention will be described. As shown in FIG. 3A, a patterned structure 300 is etched directly into a semiconductor material 302, for example, silicon. As shown in FIG. 3B, patterned structure 300 is etched directly into semiconductor material 302, and a sealant or other coating 304 is disposed over patterned structure 300. The coating may have a low refractive index relative to the high refractive index of semiconductor material 302, thereby minimizing reflection from the outer surface of semiconductor material 302. Additionally, another coating (not shown), for example, a simple, quarter-wave antireflective thin-film coating, may be applied as a final layer to eliminate any remaining surface reflection. Coating 304 as well as the additional coating may be composed of, for example, polymers such as PMM, tantalum pentaoxide, titanium dioxide, magnesium fluoride, silicon dioxide, or other optically transparent material. Preferably, coating 304 is composed of silicon dioxide. As shown in FIG. 3C, a material 306 may be deposited onto a semiconductor substrate 308, and patterned surface 300 may be etched in material 306. Material 306 may be composed of semiconductor material, and material 306 is preferably composed of silicon.

The patterned structure according to the present invention may be optimized by using optical design software to adapt the form of the patterned structure for specific effects. Commercial suppliers of such design software include Optical Research associates, Pasadena, Cali. and Optiwave Corporation, Ottawa, ON, Canada. additionally, the present invention is not limited to the patterned structure shown in FIGS. 2A, 2B, and 3A–3C. Other desirable effects may be generated by various periodic arrays covering a semiconductor facet. For example, various patterned structures such as lines, cones, holes, grids, and microlens arrays may be used to reduce reflection from the semiconductor facet and to suppress longitudinal modes of the laser diode. Additionally, such patterns may be used for mode adaption, mode shaping, and beam shaping.

The patterned structure of the present invention may be formed by several known techniques. Preferably, a substrate is first coated with a photosensitive material such as photoresist. The photoresist is then exposed to an optical pattern whereby the optical pattern is recorded as physical surface structure. The optical pattern may be generated by hollography or other interference patterning techniques. Alternatively, the source illumination may be projected through a pattern photomask and onto the target. After the photoresist is imparted with a physical pattern, it becomes a mask for an etching process that imparts the substrate with the desired pattern. Hollographic Lithography Systems of Optical Switch Corporation, Bedford, Mass. is one commercial source for interference lithography systems suited for the process described above.

Figures 4A, 4B:
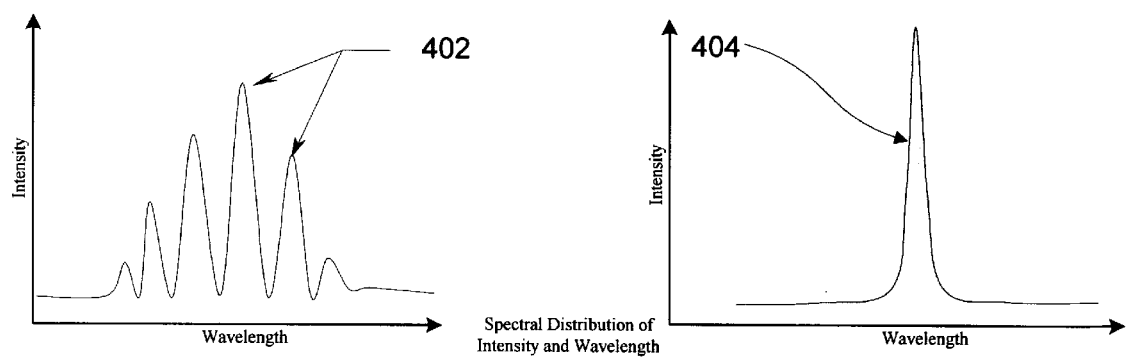
FIG. 4A illustrates the longitudinal modes output from a free-running Fabry-Perot laser.
FIG. 4B illustrates the longitudinal mode output from a semiconductor laser diode according to an embodiment of the present invention.

The present invention provides a patterned structure disposed on one or more facets of a semiconductor gain medium. By applying a motheye structure to the front facet of a Fabry-Perot laser, the reflection from the front facet is suppressed. Consequently, the laser's natural longitudinal modes are suppressed, resulting in an almost singular output wavelength when combined with an appropriate external cavity reflector. Referring now to FIGS. 4A and 4B, the outputs of a conventional laser and a laser according to the present invention will be compared. FIG. 4A shows the longitudinal modes 402 output from a conventional, free-running Fabry-Perot laser. As shown, the longitudinal modes of the conventional output vary in intensity and wavelength. In contrast, FIG. 4B shows the longitudinal mode 404 output from a semiconductor laser diode according to the present invention. As shown, the laser's natural longitudinal modes and reflection from the front facet are suppressed so that stabilization with a wavelength-selective external cavity reflector is effective in providing a more homogeneous longitudinal mode output that approaches a single wavelength.

Figure 6:
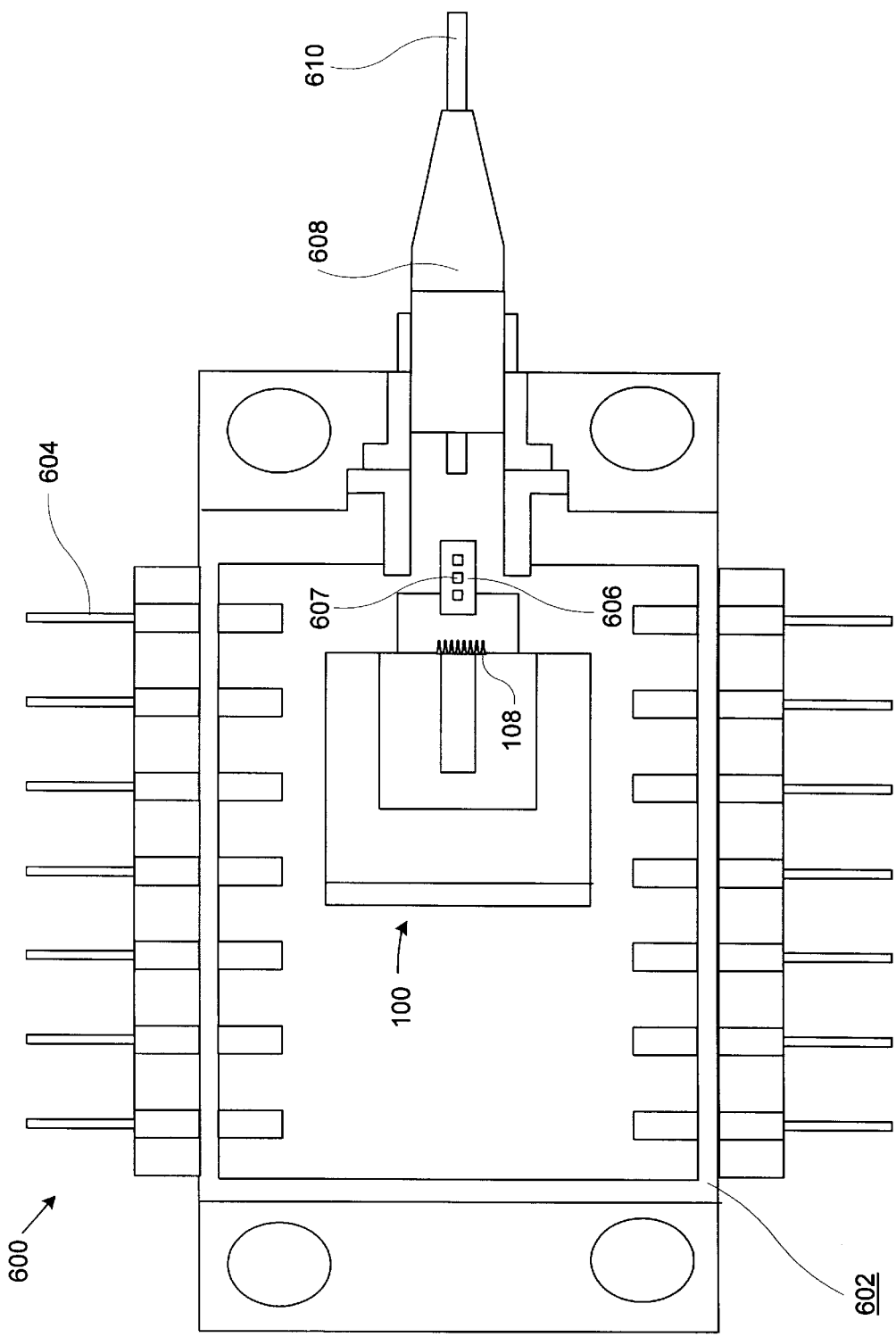
FIG. 6 illustrates an optical assembly, including a laser according to the present invention, disposed in a package suitable for mounting in electronic circuitry.

Referring now to FIG. 5, an optical communication system 500 according to another exemplary embodiment of the present invention will be described. System 500 includes gain device 100 coupled to an optical element 502. Gain device 100 includes patterned structure 108 disposed on its front facet. Optical element 502 includes a waveguided pathway 503, for example, a PLC or a flexible optical fiber. A wavelength-selective reflector 504 is disposed in optical element 502, thus defining the wavelength-selective reflection of the external cavity mirror. A partial reflector (not shown) and a bandpass filter (not shown) that is angled relative to the optical path may be substituted for Reflector 504. System 500 may be mounted on a silicon submount and temperature stabilized with a thermal electrical cooler. Additionally, system 500 may be housed in a package such as a butterfly package, as shown in FIG. 6 and described below, or a dual in-line pin package.

Reflector 504 may be a Bragg reflector. The Bragg reflector may be a fiber Bragg grating such as those formed by writing refractive index undulations into the core of a UV-sensitive optical fiber using laser light. The Bragg reflector may be similarly formed into the waveguided pathway of a PLC. The Bragg reflector may be comprised of a relief pattern, for example, ridges or corrugations, formed into the surface or cladding of the waveguided pathway.

If waveguided pathway 503 is a PLC, it may be made of a glassy material. The PLC may be an ion-exchange type fabricated using an ion-exchange process. Alternatively, it may be silica on silicon fabricated with flame hydrolysis or CEPVD. Alternatively, the PLC may be fabricated using photolithography. Additionally, various structures may be used to increase the coupling efficiency and to provide modal adaption between gain device 100 and optical element 502. For example, the waveguided pathway 503 may be adapted for increased coupling efficiency by shaping its interface accordingly. For instance, if an optical fiber is used as waveguided pathway 503, then the fiber may be formed with a cone-shaped interface.

In operation, gain device 100 emits light through patterned structure 108 on its front facet. Patterned structure 108 suppresses facet reflection and suppresses the longitudinal modes of gain device 100. The emitted light travels from gain device 100 through patterned structure 108 and into waveguided pathway 503 of optical element 502. Reflector 504 operates to achieve single frequency operation of system 500 by constructively reflecting light of a particular wavelength back into gain device 100. The light reflected back into gain device 100 stimulates photon emission at that particular wavelength from the semiconductor gain medium in gain device 100. Accordingly, lasing occurs at that particular wavelength.

Referring now to FIG. 6, an optical assembly 600, including a laser according to the present invention, suitable for mounting in electronic circuitry will be described. Assembly 600 includes a housing 602. A plurality of pins 604 are disposed in housing 602 and provide electrical connection of an electricity source (not shown) to assembly 600. Gain device 100 including patterned structure 108, a facet-to-fiber optical coupling device 606, and a fiber connection or pigtail 608 are also disposed in housing 602. At least two of the pins 604 are coupled to gain device 100 to excite the semiconductor gain medium contained therein. Optical coupling device 606 optically couples gain device 100 to pigtail 608, which is coupled to a fiber optic cable 610. Optical coupling device 606 can include an integral Bragg reflector 607. Housing 602 is preferably hermetically sealed.

In operation, gain device 100 is powered through a few pins 604 to excite the semiconductor gain medium contained therein, thereby generating light for emission from gain device 100. Gain device 100 emits the light through patterned structure 108 on its front facet. Patterned structure 108 suppresses facet reflection and suppresses the longitudinal modes of gain device 100. The emitted light travels from gain device 100 through patterned structure 108 and into optical coupling device 606. Bragg reflector 607 operates to achieve single frequency operation of system 600 similarly to the operation of system 500 discussed above, whereby the light is transmitted into fiber connection 608 and then into fiber optic cable 610.

Figure 7:
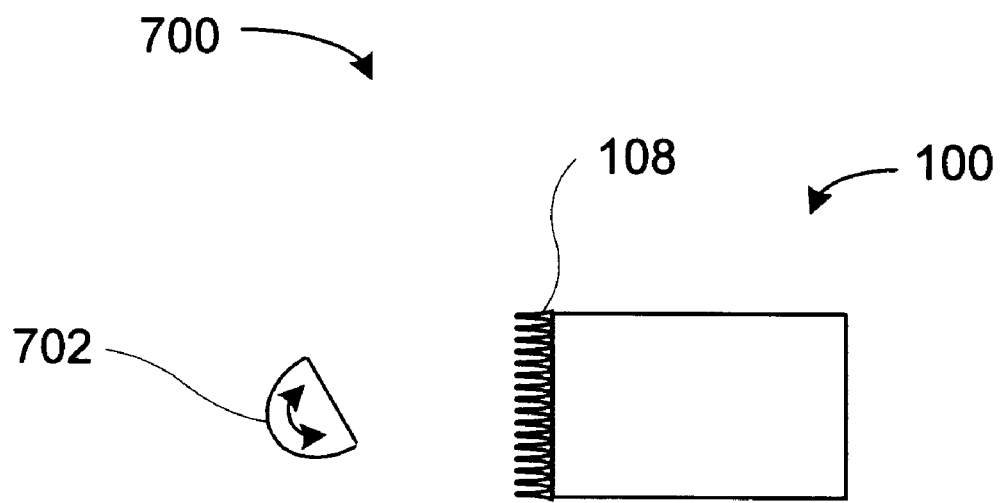
FIG. 7 illustrates an optical communication system according to another embodiment of the present invention.

Referring now to FIG. 7, an optical communication system 700 according to another exemplary embodiment of the present invention will be described. System 700 includes gain device 100 optically coupled to an MEMS element 702. Gain device 100 includes patterned surface 108 disposed on its front facet. MEMS element 702 provides external cavity tuning to set the laser wavelength according to various usage parameters. In operation, gain device 100 transmits light through patterned structure 108 to MEMS element 702. Patterned structure 108 suppresses facet reflection and suppresses the longitudinal modes of gain device 100. MEMS element 702 provides feedback to gain device 100, thereby tuning gain device 100 by controlling the feedback signal. The feedback may occur via constructive and destructive interference. The feedback may arise by, for example, a Mach-Zender interferometer, an etalon, ruled defraction grating, establishment of the Bragg condition, hollographic grating, Fabry-Perot mechanisms, or other interference means.

Figure 8:
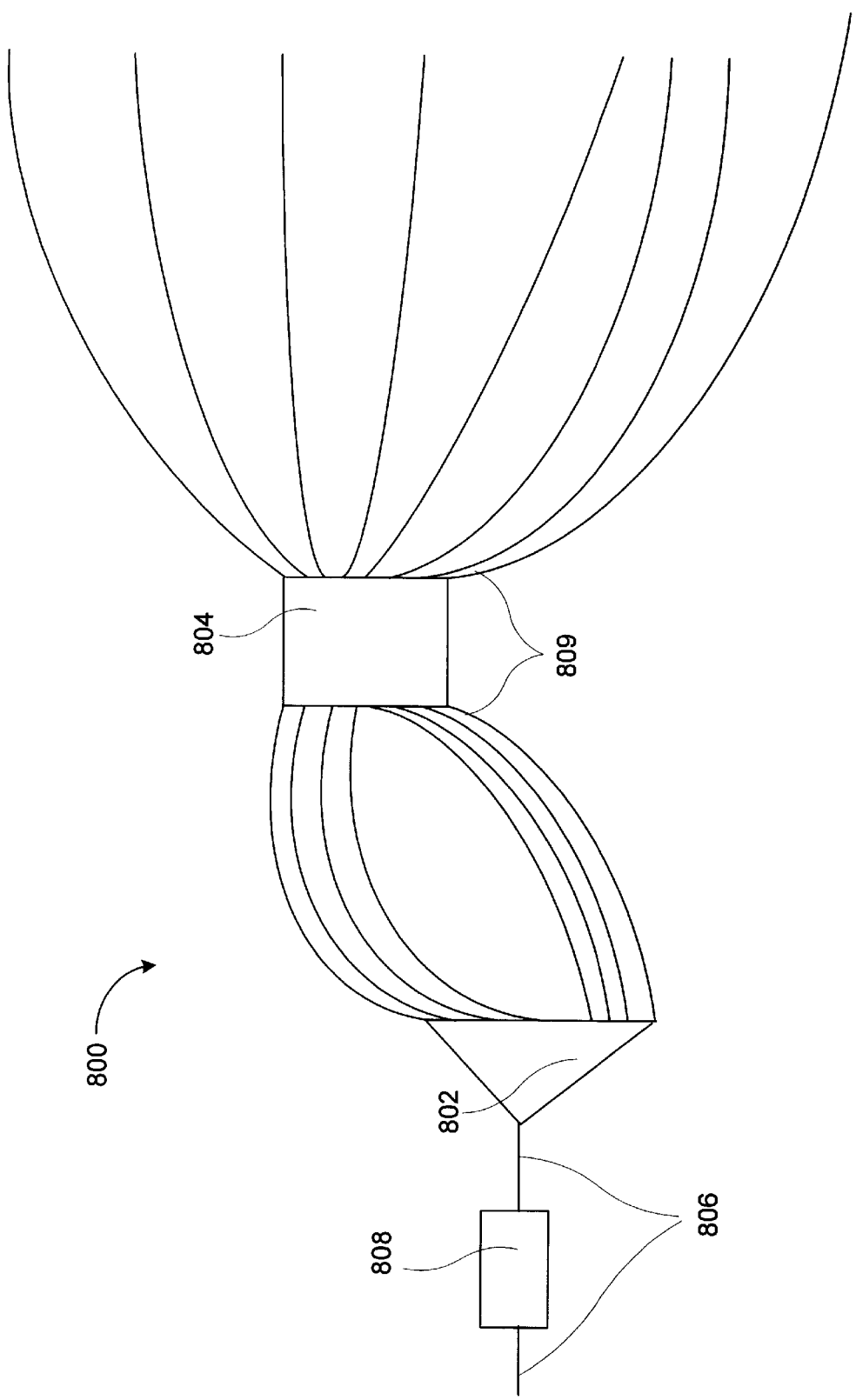
FIG. 8 illustrates an optical communication system according to another embodiment of the present invention.

Referring now to FIG. 8, an optical communication system 800 according to another exemplary embodiment of the present invention will be described. System 800 includes a semiconductor optical amplifier (SOA) 808. Amplifier 808 has a structure similar to gain device 100 (FIG. 1) and is optically coupled to multiplexer/demultiplexer units 802, 804 by optical pathways 806, 809. System 800 may be a phased array unit, for example an AWG Array Wave Guide, as shown in FIG. 8. System 800 may be a PLC-based multiplexing/demultiplexing unit as is typical of AWG implementations. System 800 may also be an optical add/drop multiplexer that operates on a single channel. SOA 808 boosts a signal traveling along optical pathway 806. In this embodiment, it is preferable to apply the patterned structure to both front and rear facets of SOA 808 to allow SOA 808 to function in a traveling wave configuration. Additionally, the facets of SOA 808 may also be angled (not shown in FIG. 1). Increased suppression of longitudinal modes may be realized by applying the patterned structure to a facet that is angled relative to light flow. This technique may also be used in conjunction with laser stabilization in addition to SOA 808.

In operation, an optical signal travels through optical pathway 806 and into SOA 808 where the optical signal is amplified. The optical signal is amplified by an optical gain of an excited semiconductor gain medium disposed in SOA 808. Amplification occurs as previously described. SOA 808 transmits the amplified optical signal through optical pathway 806 to multiplexer/demultiplexer unit 802, which further transmits the optical signal through optical pathways 809 to multiplexer/demultiplexer unit 804. Since many SOAs suffer from channel-to-channel crosstalk, it may be preferable to position SOAs on the output optical pathways 709 where each pathway carries a separate DWDM channel. However, this configuration is dependent upon SOA type and cross talk tolerance of the network into which the device is deployed.

Referring now to the process illustrated in FIG. 9, certain steps in the process described below must naturally precede others for the present invention to function as described. However, the present invention is not limited to the order of the steps described if such order or sequence does not alter the functionality of the present invention. That is, it is recognized that some steps may be performed before or after other steps without departing from the scope and spirit of the present invention. Further, certain steps can be eliminated without departing from the scope and spirit of the present invention.

Figure 9:
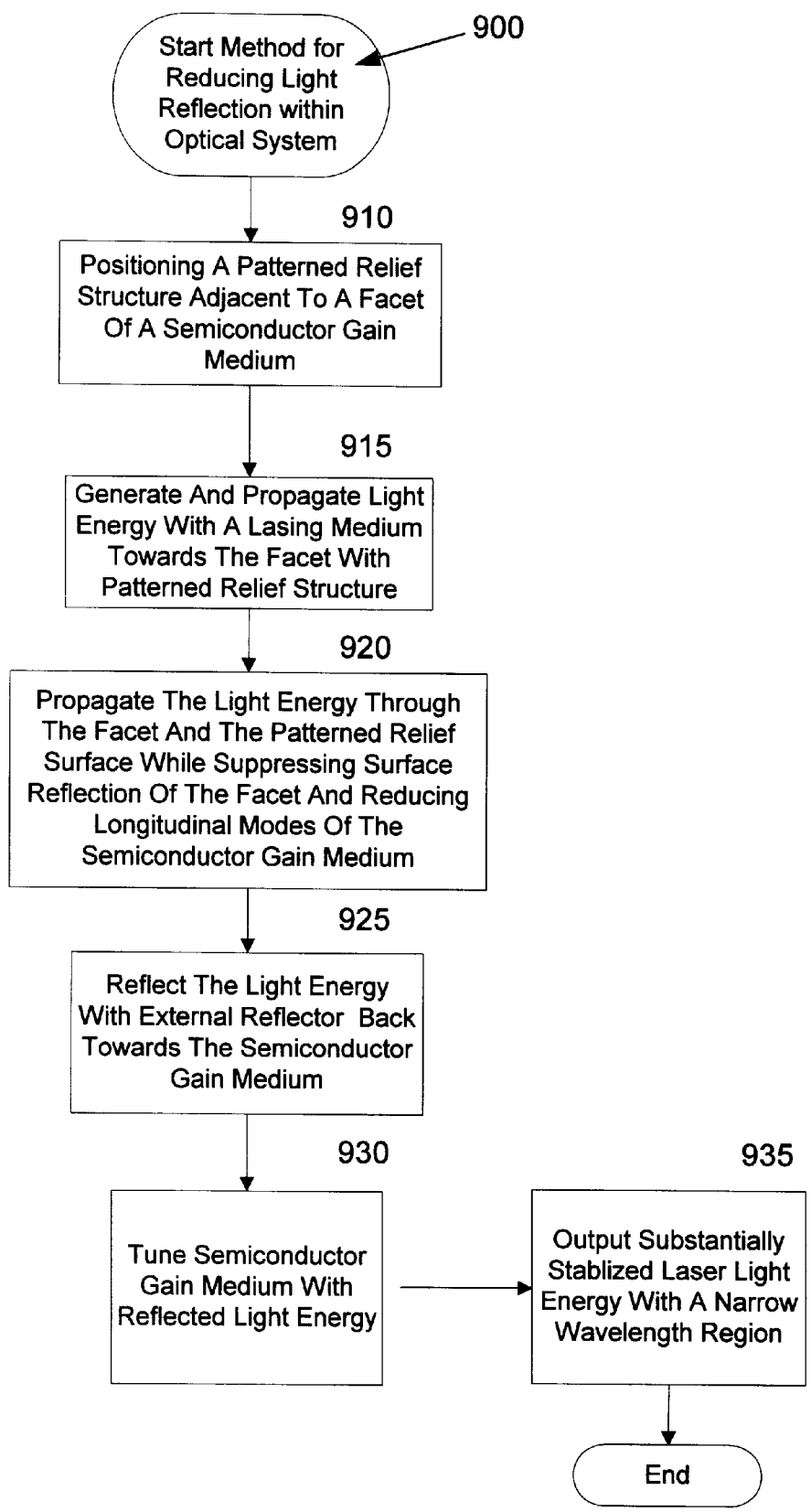
FIG. 9 illustrates a flow chart of a method for controlling longitudinal modes of a laser according to the present invention.

FIG. 9 illustrates a process 900 for reducing light reflection within an optical system according to an exemplary embodiment of the present invention will be described. The process begins in step 910 where a patterned structure 108 according to the present invention described above is positioned adjacent to a facet 104 of a semiconductor gain medium 102. Then in step 915, light energy is generated and propagated within a semiconductor gain medium 102 towards the facet 104 with the patterned relief structure 108. In step 920, the light energy is then propagated through the facet 104 and the patterned relief structure 108 where the patterned relief structure 108 suppresses the surface reflection of the facet in order to reduce the longitudinal modes of the semiconductor gain medium.

The process can be stopped at step 920 since this step and the previous steps before step 920 can be used to amplify weak optical signals. However, for laser applications, the process can continue to the remaining steps after step 920 that describe feedback to the semiconductor medium which causes the semiconductor medium to lase.

In step 925, light energy can be reflected back into the semiconductor gain medium with an external reflector such as reflector 504 illustrated in FIG. 5. In step 930, the reflected light energy tunes the semiconductor medium 102. In step 935, the laser light emitted or outputted from the semiconductor gain medium 102 is substantially stabilized and has a narrow wavelength region.

Although specific embodiments of the present invention have been described above in detail, it will be understood that this description is merely for purposes of illustration. Various modifications of, and equivalent steps corresponding to, the disclosed aspects of the preferred embodiments, in addition to those described above, may be made by those skilled in the art without departing from the spirit of the present invention defined in the following claims, the scope of which is to be accorded the broadest interpretation so as to encompass such modifications and equivalent structures.

What is claimed is:

1. A system for reducing reflection within an optical system, comprising:
   a semiconductor gain medium comprising a front facet and a rear facet, said semiconductor gain medium producing light energy when excited; and
   a patterned relief surface disposed on one of said front facet and said rear facet, the patterned relief surface reducing reflection of one of said front facet and said rear facet,
   wherein at least one of said front facet and said rear facet allows part of the light energy to transmit therethrough.

2. The system according to claim 1, wherein said patterned surface comprises a motheye structure.

3. The system according to claim 1, wherein said patterned surface comprises:
   a substrate; and
   a plurality of conical posts protruding from said substrate.

4. The system according to claim 3, further comprising:
   an antireflection coating disposed on said patterned surface.

5. The system according to claim 3, wherein a height of each of said plurality of conical posts is greater than 0.4 times a wavelength of the part of the light energy transmitted through one of said front and rear facets.

6. The system according to claim 5, wherein a post-to-post spacing between each of said plurality of conical posts is less than the wavelength of the part of the light energy transmitted through one of said front and rear facets divided by an index of refraction of said semiconductor gain medium.

7. The system according to claim 6, wherein said laser operates in one of a 1310 nanometer window and a 1550 nanometer window.

8. The system according to claim 3, wherein said conical posts have a pyramid shape.

9. The system according to claim 3, further comprising an optical pathway optically coupled to one of said front facet and said rear facet.

10. The system according to claim 3, wherein said optical pathway is one of a guided wave path and an optical fiber.

11. The system according to claim 10, wherein said optical pathway comprises a wavelength-selective reflector.

12. The system according to claim 11, wherein said wavelength-selective reflector comprises a Bragg reflector.

13. The system according to claim 3, further comprising:
   an external laser control device optically coupled to one of said front facet and said rear facet, said device reflecting a wavelength of the part of the light energy transmitted through one of said front facet and said rear facet.

14. The system according to claim 13, wherein said device comprises a microelectromechanical system component.

15. The system according to claim 13, wherein said device comprises a wavelength selective reflector.

16. The system according to claim 1, wherein said patterned surface comprises a pattern of lines.

17. The system according to claim 1, wherein said patterned surface comprises a pattern of holes.

18. The system according to claim 1, wherein said patterned surface comprises a pattern of grids.

19. The system according to claim 1, wherein said patterned surface comprises a pattern of microlens arrays.

20. A system for light energy amplification, comprising:
   a first facet of a semiconductor gain medium for receiving an optical signal and through which the optical signal passes;
   a second facet of the semiconductor gain medium for receiving the optical signal from the first facet and through which the optical signal passes, said semiconductor gain medium being excited to provide gain for amplifying the optical signal; and
   a patterned relief surface that reduces reflection disposed on one of said first and second facets,
   wherein the optical signal is transmitted through said first facet and the patterned relief surface and amplified by the gain of said semiconductor gain medium, and wherein the amplified optical signal is transmitted through said second facet.

21. The system according to claim 20, wherein said patterned surface is disposed on said first and second facets.

22. The system according to claim 21, wherein said first and second facets are angled with respect to a path of the optical signal.

23. The system according to claim 20, further comprising:
   a multiplexing/demultiplexing unit optically attached to said second facet.

24. A method for reducing reflection within a semiconductor gain medium, comprising the steps of:
   positioning a motheye structure adjacent to a facet of a semiconductor gain medium;
   generating and propagating light energy towards the facet; and
   propagating the light energy through the facet and the motheye structure, the motheye structure suppressing surface reflection of the facet and reducing longitudinal modes of the semiconductor gain medium.

25. The method according to claim 24, wherein said step of positioning a motheye structure comprises the step of positioning a substrate having a plurality of conical posts protruding therefrom adjacent to the facet.

26. The method according to claim 24, wherein said step of positioning a motheye structure comprises the step of positioning a plurality of conical posts adjacent to the facet.

27. The method according to claim 26, wherein said step of positioning a motheye structure further comprises the step of positioning an antireflection coating over the plurality of conical posts.

28. The method according to claim 26, wherein said step of positioning the plurality of conical posts comprises positioning conical posts having a height greater than about 0.4 times a wavelength of the light energy transmitted through the facet.

29. The method according to claim 26, wherein said step of positioning a plurality of conical posts comprises positioning conical posts having a post-to-post spacing between each of the plurality of conical posts that is less than a wavelength of the light energy transmitted through the motheye structure divided by an index of refraction of the semiconductor gain medium.

30. The method according to claim 24, further comprising the step of:
    tuning the semiconductor gain medium to a predefined wavelength with an external laser control device optically coupled to the semiconductor gain medium.

31. The method according to claim 30, wherein said step of tuning comprises reflecting the light energy towards the semiconductor gain medium with a reflector mounted to a microelectromechanical system component.

32. The method according to claim 31, wherein the step of tuning comprises reflecting the light energy towards the semiconductor gain medium with a wavelength selective reflector.

33. A system for reducing back reflection within a dense wavelength division multiplexing fiber optic communications network, comprising:
    a semiconductor gain medium for emitting dense wavelength division multiplexing light signals; and
    a motheye structure for reducing Fresnel reflections, said signals being transmitted through said motheye structure.

34. The system of claim 33, wherein said motheye structure minimizes back reflected light propagating within said semiconductor gain medium.

35. The system of claim 33, further comprising a MEMS article for manipulating beams of laser light.

36. The system of claim 33, wherein said motheye structure comprises a patterned relief structure of substantially conical posts.

37. The system of claim 33, wherein said semiconductor gain medium receives dense wavelength division multiplexing signals at a first power level, and said semiconductor gain medium amplifies the dense wavelength division multiplexing signals to a second power level greater than the first power level.

38. The system of claim 33, wherein said motheye structure comprises a patterned relief structure of substantially conical posts.

* * * * *

UNITED STATES PATENT AND TRADEMARK OFFICE
CERTIFICATE OF CORRECTION

PATENT NO.    : 6,483,635 B1
DATED         : November 19, 2002
INVENTOR(S)   : Michael L. Wach It is certified that error appears in the above-identified patent and that said Letters Patent is hereby corrected as shown below:

Column 14,
Line 1, "The method according to Claim 31" should read -- The method according to Claim 30 --.
Lines 19-21, The entire of Claim 36 should be replaced with -- The system of Claim 33, further comprising a reflector for reflecting light emitted from the semiconductor gain medium into the semiconductor gain medium, the system forming a tunable laser. --.

Signed and Sealed this

Third Day of June, 2003

JAMES E. ROGAN
*Director of the United States Patent and Trademark Office*